United States Patent
Mui et al.

(10) Patent No.: US 7,800,441 B2
(45) Date of Patent: Sep. 21, 2010

(54) FEEDBACK AMPLIFIER AND AUDIO SYSTEM THEREROF

(75) Inventors: Vincent Mui, San Jose, CA (US); Lance Wong, San Francisco, CA (US); Aditya Raina, Cupertino, CA (US)

(73) Assignee: Nuvoton Technology Corporation (TW)

( * ) Notice: Subject to any disclaimer, the term of this patent is extended or adjusted under 35 U.S.C. 154(b) by 62 days.

(21) Appl. No.: 12/276,253

(22) Filed: Nov. 21, 2008

(65) Prior Publication Data
US 2010/0127772 A1    May 27, 2010

(51) Int. Cl.
*H03F 1/36* (2006.01)
(52) U.S. Cl. .................................................. 330/86
(58) Field of Classification Search .................. 330/86, 330/282, 284; 381/121
See application file for complete search history.

(56) References Cited

U.S. PATENT DOCUMENTS

2004/0012440 A1*  1/2004  Hughes et al. ............... 330/85

* cited by examiner

*Primary Examiner*—Steven J Mottola
(74) *Attorney, Agent, or Firm*—Townsend and Townsend and Crew LLP

(57) ABSTRACT

A feedback amplifier includes an operational amplifier having an input end and an output end. A first resistor is coupled with the input end of the operational amplifier. A second resistor has a first end coupled with the input end of the operational amplifier and a second end coupled with the output end of the amplifier. A voltage divider has a first end being operably coupled with the output end of the operational amplifier and a second end being analog grounded. In an embodiment, the feedback amplifier further includes a first switch coupled to the first end of the voltage divider and the output end of the operational amplifier, and a second switch coupled to an internal node of the voltage divider. In an embodiment, the feedback amplifier is configured to provide attenuation when the first switch is open and second switch is closed.

21 Claims, 3 Drawing Sheets

FEEDBACK AMPLIFIER AND AUDIO SYSTEM THEREROF

FIELD OF THE INVENTION

The present invention relates to electronic circuit techniques. More particularly, the present invention relates to feedback amplifiers and audio systems thereof.

BACKGROUND OF THE INVENTION

Amplifier circuits have been used in various electronic devices such as audio devices. Amplifier circuits increase powers and/or amplitudes of signals. In many applications, power amplifier circuits are used at the output stage of a system to drive an external device. For example, an output power amplifier has been used to drive an external speaker. The output power amplifier may need to provide a gain from about −57 dB to about 6 dB for the audio system.

FIG. 1 is a conventional single-stage feedback amplifier. In FIG. 1, the single-stage feedback amplifier 100 includes an operational amplifier 110 and resistors having resistances r1 and r2. The single-stage feedback amplifier 100 provides a gain of about 20*log(r2/r1). In order to obtain a gain of about −57 dB, r2 (e.g., 140Ω) is much smaller than r1 (e.g., 100 kΩ). The low resistance of r2 results in a parasitic resistance at r2 due to layout mismatch and long metal routing and the operation of the single-stage feedback amplifier 100 suffers a gain offset. Additionally, a large current from the previous stage may be needed to drive the resistor having the low resistance r2.

In order to solve the issue described above, a conventional two-stage feedback amplifier is provided as shown in FIG. 2. In FIG. 2, the two-stage feedback amplifier 200 consists of two operational amplifiers 210 and 220 and resistors r1-r4. To cover the gain range of 63 dB, each stage of the two-stage feedback amplifier 200 covers about 31.5 dB. That is, the two-stage feedback amplifier 200 provides a gain of about 20*log(r2/r1)+20*log(r4/r3) which is equal to 31.5 dB+31.5 dB. Since the two-stage feedback amplifier 200 uses two operational amplifiers, more chip areas are used and more currents are consumed during the operation. In addition, two operational amplifiers can contribute more noise sources and degrade the noise performance and signal-to-noise ration (SNR).

From the foregoing, improvements to the conventional feedback amplifiers are desired.

BRIEF SUMMARY OF THE INVENTION

Embodiments of the present invention relate to feedback amplifiers providing a wide range of gain of about 63 dB. The wide range gain can be achieved by operably coupling a voltage divider to an operational amplifier.

According to an exemplary embodiment, a feedback amplifier includes an operational amplifier having an input end and an output end. A first resistor is coupled with the input end of the operational amplifier. A second resistor has a first end coupled with the input end of the operational amplifier and a second end coupled with the output end of the amplifier. A voltage divider has a first end being operably coupled with the output end of the operational amplifier and a second end being analog grounded.

In one embodiment, a second resistance (R2) of the second resistor is about twice of a first resistance (R1) of the first resistor.

In another embodiment, the feedback amplifier further includes a first switch coupled to the first end of the voltage divider and the output end of the operational amplifier, and a second switch coupling the output end of the operational amplifier with a node in the voltage divider between the first end and the second end of the voltage divider to divide the resistance of the voltage divider into a third resistance (R3) and a fourth resistance (R4).

In an alternative, the first switch is closed when the feedback amplifier provides attenuation when the first switch is open and the second switch is closed.

In one embodiment, the voltage divider is a polysilicon resistor.

In a specific embodiment, the ratio of R4/(R3+R4) is between about 0 and about 1/1000. In some embodiments, the first and second resistors are variable resistors. In a specific embodiment, the third resistance (R3) and the fourth resistance (R4) are adjustable in response to a control signal.

In an alternative, the feedback amplifier is operably configured to provide a gain between about −57 dB and about 6 dB.

According to another embodiment of the present invention, a feedback amplifier includes an operational amplifier comprising an input end and an output end. A first resistor has a first resistance (R1) and is coupled with the input end of the operational amplifier. A second resistor has a second resistance (R2). The second resistor has a first end coupled with the input end of the operational amplifier and a second end coupled with the output end of the amplifier. A voltage divider has a first end being operably coupled with the output end of the operational amplifier. The voltage divider includes a third resistance (R3) and a fourth resistance (R4), wherein the feedback amplifier provides a gain of about 20*log(R2/R1)+ 20*log(R4/(R3+R4)).

In another embodiment, the resistance R2 is about twice of the resistance R1.

In another embodiment, the feedback amplifier further includes a first switch coupled to the first end of the voltage divider and the output end of the operational amplifier, and a second switch coupling the output end of the operational amplifier with a node in the voltage divider between the first end and the second end of the voltage divider to divide the resistance of the voltage divider into the third resistance (R3) and the fourth resistance (R4).

In an alternative, the first switch is closed when the feedback amplifier provides attenuation. In some embodiments, the first and second resistors are variable resistors. In a specific embodiment, the third resistance (R3) and the fourth resistance (R4) are adjustable in response to a control signal.

In another embodiment, the ratio of R4/(R3+R4) is between about 0 and about 1/1000.

In an alternative, the gain between about −57 dB and about 6 dB.

According to an alternative embodiment, an audio system including a speaker coupled with a feedback amplifier. The feedback amplifier includes an input end and an output end. A first resistor is coupled with the input end of the operational amplifier. A second resistor has a first end coupled with the input end of the operational amplifier and a second end coupled with the output end of the amplifier. A voltage divider has a first end being operably coupled with the output end of the operational amplifier and a second end being analog grounded.

In one embodiment, a second resistance (R2) of the second resistor is about twice of a first resistance (R1) of the first resistor.

In another embodiment, the audio system further includes a first switch coupled to the first end of the voltage divider and the output end of the operational amplifier, and a second switch coupling the output end of the operational amplifier with a node in the voltage divider between the first end and the second end of the voltage divider to divide the resistance of the voltage divider into a third resistance (R3) and a fourth resistance (R4).

In an embodiment, the first switch is closed when the feedback amplifier provides attenuation when the first switch is open and the second switch is closed.

In one embodiment, the voltage divider is a polysilicon resistor.

In a specific embodiment, wherein the ratio of R4/(R3+R4) is between about 0 and about 1/1000. In some embodiments, the first and second resistors are variable resistors. In a specific embodiment, the third resistance (R3) and the fourth resistance (R4) are adjustable in response to a control signal.

In an alternative, the feedback amplifier is operably to provide a gain between about −57 dB and about 6 dB.

Many benefits are achieved by way of the present invention over conventional techniques. For example, an embodiment of the present invention provides an easy to use design that is compatible with conventional integrated circuit design and fabrication process technologies. In embodiments of the present invention, techniques are provided for an amplifier having an adjustable gain over a wide gain range. In a specific embodiment, an amplifier is provided that has only one operational amplifier and a voltage divider having two resistors. Such design can consumes less chip area and consumes less current than conventional amplifiers having two operational amplifiers. In some embodiments, less flicker noise is generated because only one amplifier is needed as compared to conventional two-amplifier designs. Additionally, better gain accuracy can be achieved in part because the operation amplifier circuit does not need a small resistance component in a critical path.

These and other embodiments of the invention along with many of its advantages and features are described in more detail in conjunction with the text below and attached figures It should be understood, however, that the invention is not limited to the precise arrangements and instrumentalities shown.

BRIEF DESCRIPTION OF THE DRAWINGS

A further understanding of the nature and advantages of the present invention may be realized by reference to the remaining regions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Embodiments of the present invention relate to audio systems and feedback amplifiers providing a wide range gain from about 6 dB to about −57 dB. The wide range gain can be achieved by operably coupling a voltage divider to an operational amplifier. In a specific embodiment the operational amplifier is coupled to resistors having resistance R1 and R2, which provides a gain of about 20*log(R2/R1) in dB. The voltage divider is coupled with an output end of the operational amplifier if the feedback amplifier provides attenuation. In embodiments, the voltage divider can provide resistances R3 and R4 which provide attenuation of about −20*log (R4/(R3+R4)). The exemplary feedback amplifier can provide a gain of about 20*log(R2/R1)+20*log(R4/(R3+R4)) in dB. By using the voltage divider, the feedback amplifier can provide the wide range gain, having a small chip size and low current consumption.

Figure 1:
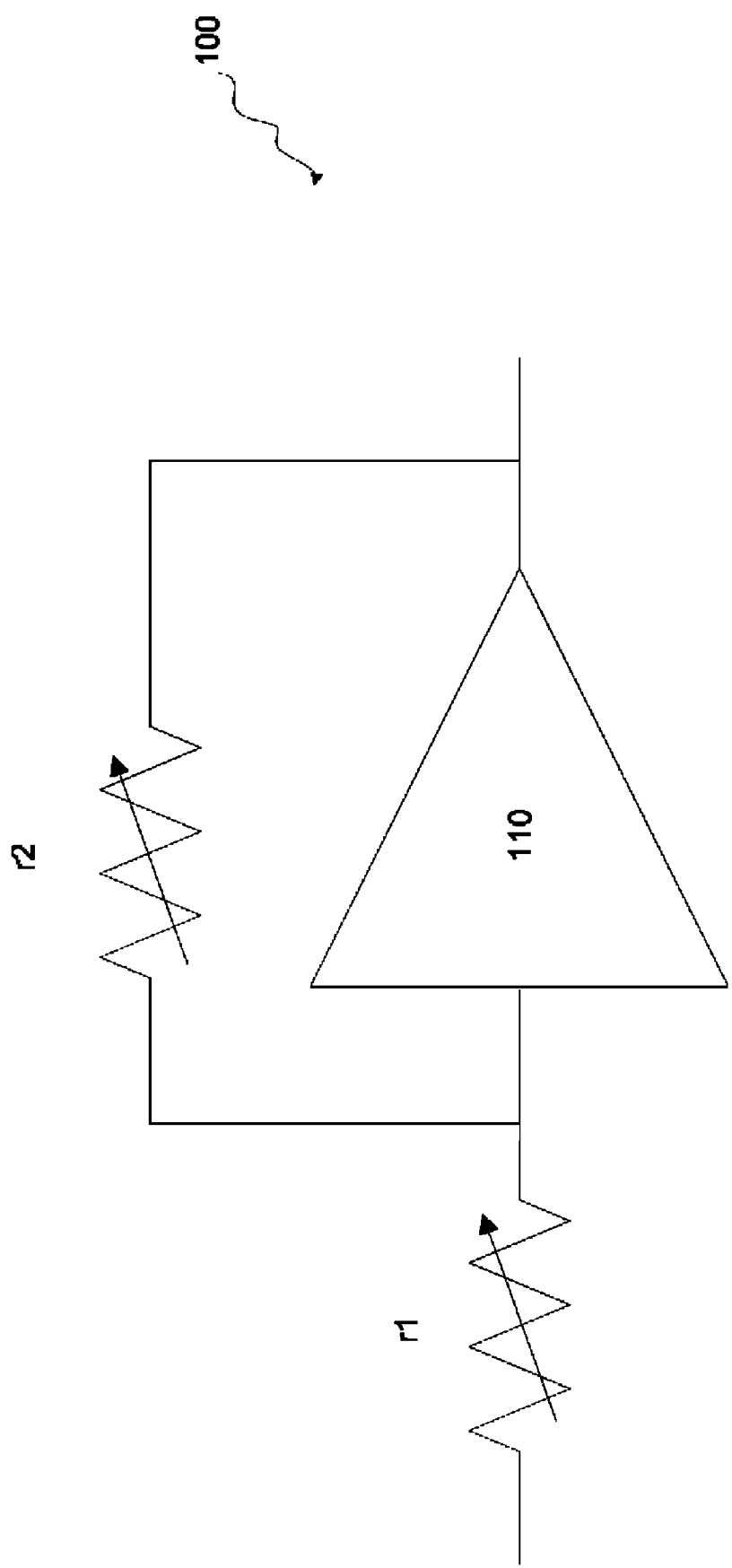
FIG. 1 is a drawing showing a conventional single-stage feedback amplifier.
Figure 2:
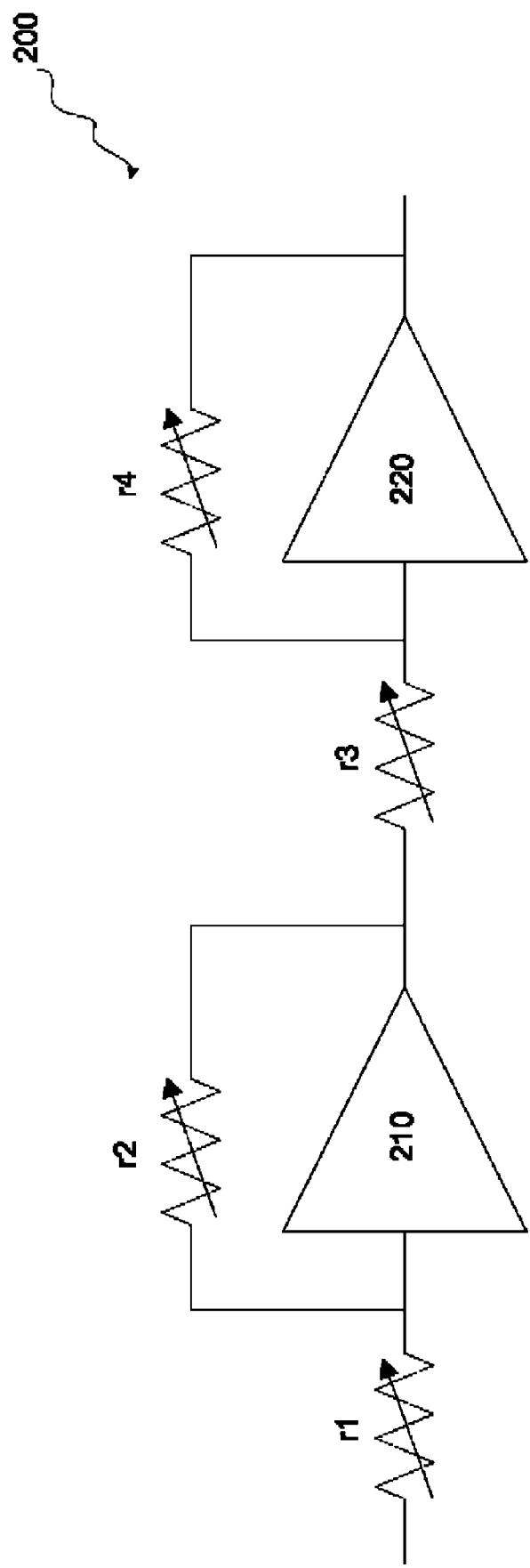
FIG. 2 is a drawing showing a conventional two-stage feedback amplifier.
Figure 3:
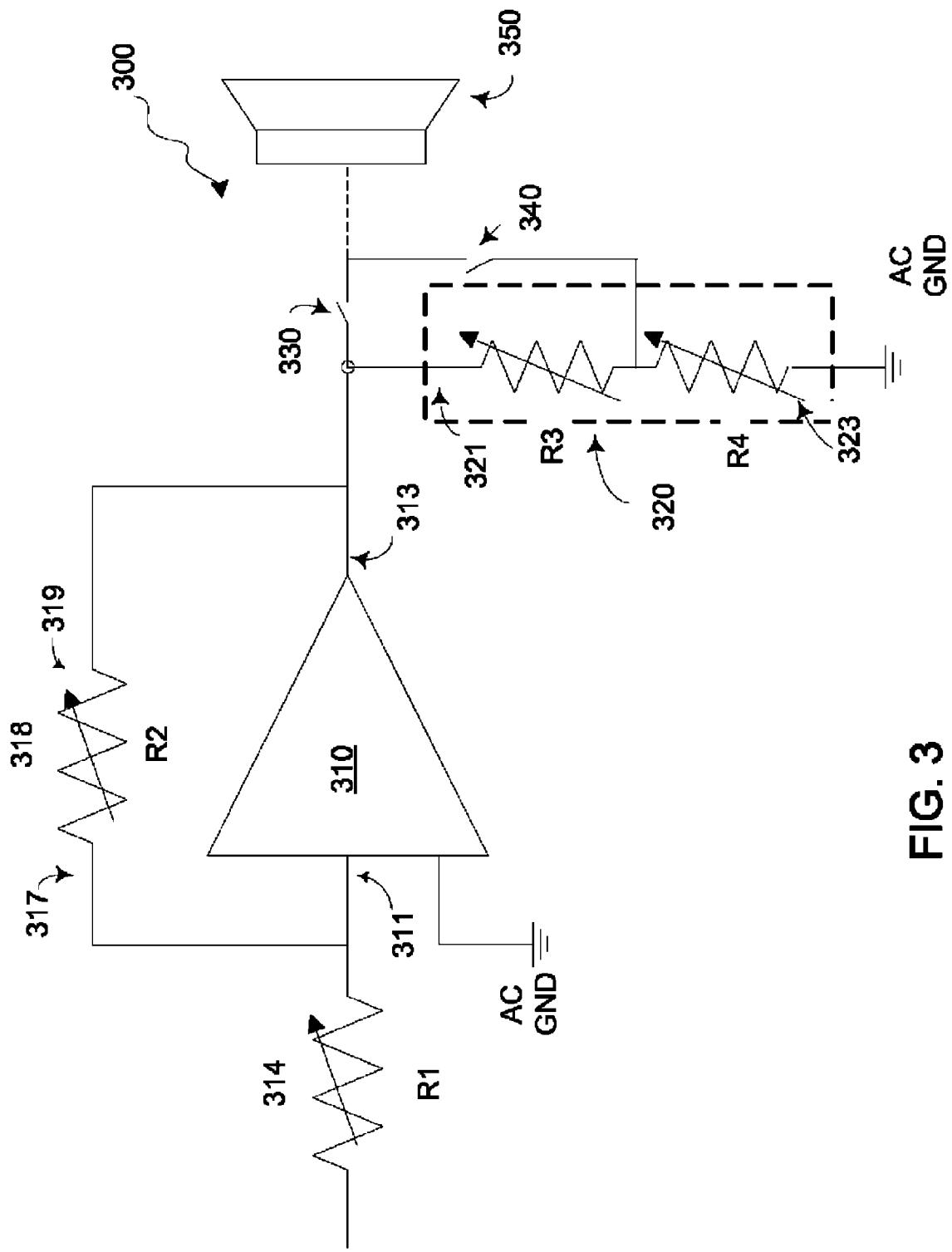
FIG. 3 is a simplified schematic drawing illustrating an exemplary feedback amplifier according to an embodiment of the present invention.

FIG. 3 is a schematic drawing illustrating an exemplary feedback amplifier coupled with a speaker. In FIG. 3, the feedback amplifier 300 can include an operational amplifier 310, which has an input end 311 and an output end 313. The output end 313 of the feedback amplifier 300 can be coupled with a speaker 350. Depending on the embodiment, there can be intermediate stages between feedback amplifier 300 and speaker 350, as shown by the dotted line in FIG. 3. A resistor 314 having a resistance R1 can be coupled with the input end 311 of the operational amplifier 310. Another resistor 318 having a resistance R2 has a first end 317 coupled with the input end 311 of the operational amplifier 310 and a second end 319 coupled with the output end 313 of the operational amplifier 310. A voltage divider 320 can have a first end 321 operational coupled with the output end 313 of the operational amplifier 310 and a second end 323 that is analog grounded, i.e., coupled to an AC ground.

In embodiments, the voltage divider 320 is operably coupled with the output end 313 of the operational amplifier 310. In an embodiment, when switch 330 is open and switch 340 is open, the feedback amplifier 300 can be configured to provide attenuation, i.e., with a gain of less than 1. In some embodiments, the voltage divider 320 can be a resistor and include at least one switch 340, which is tapped to a desired location of the resistor to divide the resistor into resistances R3 and R4 as shown in FIG. 3. The switch 340 can be coupled between the first end 321 and the second end 323 of the resistor. In embodiments, the resistor can be a variable resistor or a plurality of serial of resistor segments. In a specific embodiment, the third resistance (R3) and the fourth resistance (R4) are adjustable in response to a control signal. Similarly, in some embodiments, the first and second resistors are variable resistors, which can be controlled with a control signal or, alternative, can be programmable resistors whose resistance values can be selected by stored code. In embodiments, the resistor of the voltage divider 320 can be a polysilicon resistor with low voltage coefficients.

Following is the description of the operation of the feedback amplifier 300. The feedback amplifier 300 can provide a gain represented by the formula as shown and further discussed below.

$$\text{Gain}=20*\log(R2/R1)+20*\log(R4/(R3+R4))$$

In embodiments for providing a gain, the switch 330 can be closed. As shown, the voltage divider 320 can be spaced from the output end 313 of the operational amplifier 310. The feedback amplifier 300 can provide a gain of about 20*log (R2/R1). For example, the resistances R1 and R2 are about 10 kΩ and about 20 kΩ, respectively. The ratio of R2/R1 can be about 2:1. The feedback amplifier 300 can thus provide a gain of about 6 dB.

In embodiments for providing attenuation, the switch 330 is opened. The switch 340 can be selected and closed. Due to the coupling of the voltage divider 320 with the output end 313 of the operational amplifier 310, the feedback amplifier 300 can provide a gain of about 20*log(R2/R1)+20*log(R4/(R3+R4)) in dB. For example, the ratio of the resistances R2/R1 is about 2:1. The resistance R4 is about 10Ω and the resistance R3 is about 10 kΩ. The gain obtained based on the formula described above can be of about −57 dB. By varying the ratio of R4/(R3+R4), the feedback amplifier 300 can desirably provide a gain range from about 6 dB to about −57 dB or higher. It is noted that the ratio and resistances R1-R4 are merely examples. They can be modified to achieve the wide gain range, such as from about 6 dB to about −57 dB. It is also noted that the voltage divider 320 is not limited to the resistor described above in conjunction with FIG. 3. Any transistors, diodes, circuits or combinations thereof that can desirably divide voltages to provide attenuation as shown in the formula set forth above can be used.

As noted, the feedback amplifier 300 can include a single operational amplifier 310, such that the design area of the feedback amplifier 300 is small and the current consumed during the operation of the feedback amplifier 300 is low. It is noted that though merely showing a single operational amplifier in FIG. 3, the scope of the invention is not limited thereto. Two or more operational amplifiers and resistors can be selectively added to achieve the desired wide range gain.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A feedback amplifier comprising:
an operational amplifier having an input end and an output end;
a first resistor coupled with the input end of the operational amplifier;
a second resistor having a first end coupled with the input end of the operational amplifier and a second end coupled with the output end of the amplifier;
a voltage divider having a first end being operably coupled with the output end of the operational amplifier and a second end being analog grounded;
a first switch coupled to the first end of the voltage divider and the output end of the operational amplifier; and
a second switch coupling the output end of the operational amplifier with a node in the voltage divider between the first end and the second end of the voltage divider to divide the resistance of the voltage divider into a third resistance (R3) and a fourth resistance (R4).

2. The feedback amplifier of claim 1, wherein a second resistance (R2) of the second resistor is about twice of a first resistance (R1) of the first resistor.

3. The feedback amplifier of claim 1, wherein the feedback amplifier is configured to provide attenuation when the first switch is open and the second switch is closed.

4. The feedback amplifier of claim 1, wherein the ratio of R4/(R3+R4) is between about 0 and about 1/1000.

5. The feedback amplifier of claim 1, wherein the first and second resistors are variable resistors.

6. The feedback amplifier of claim 1, wherein the third resistance (R3) and the fourth resistance (R4) are adjustable in response to a control signal.

7. The feedback amplifier of claim 1, wherein the voltage divider comprises a polysilicon resistor.

8. The feedback amplifier of claim 1, wherein the feedback amplifier is operably configured to provide a gain between about −57 dB and about 6 dB.

9. A feedback amplifier comprising:
an operational amplifier comprising an input end and an output end;
a first resistor having a first resistance (R1) and being coupled with the input end of the operational amplifier;
a second resistor having a second resistance (R2), the second resistor having a first end coupled with the input end of the operational amplifier and a second end coupled with the output end of the amplifier; and
a voltage divider having a first end being operably coupled with the output end of the operational amplifier and a second end operably coupled with an analog ground, the voltage divider including a third resistance (R3) and a fourth resistance (R4), wherein the feedback amplifier provides a gain of about 20*log(R2/R1)+20*log(R4/(R3+R4)).

10. The feedback amplifier of claim 9, wherein R2 is about twice of R1.

11. The feedback amplifier of claim 9 further comprising:
a first switch coupled to the first end of the voltage divider and the output end of the operational amplifier; and
a second switch coupling the output end of the operational amplifier with a node in the voltage divider between the first end and the second end of the voltage divider to divide the resistance of the voltage divider into the third resistance (R3) and the fourth resistance (R4).

12. The feedback amplifier of claim 11, wherein the feedback amplifier is configured to provide attenuation when the first switch is open and the second switch is closed.

13. The feedback amplifier of claim 9, wherein the ratio of R4/(R3+R4) is between about 0 and about 1/1000.

14. The feedback amplifier of claim 9, wherein the gain between about −57 dB and about 6 dB.

15. An audio system comprising:
a speaker; and
a feedback amplifier coupled to the speaker, the feedback amplifier including:
- an operational amplifier comprising an input end and an output end, the output end being coupled with the speaker;
- a first resistor coupled with the input end of the operational amplifier;
- a second resistor having a first end coupled with the input end of the operational amplifier and a second end coupled with the output end of the amplifier;
- a voltage divider having a first end being operably coupled with the output end of the operational amplifier and a second end being analog grounded;

a first switch coupled to the first end of the voltage divider with the output end of the operational amplifier; and
a second switch coupling the output end of the operational amplifier with a node in the voltage divider between the first end and the second end of the voltage divider to divide the resistance of the voltage divider into a third resistance (R3) and a fourth resistance (R4).

16. The audio system of claim 15, wherein a second resistance (R2) of the second resistor is about twice of a first resistance (R1) of the first resistor.

17. The audio system of claim 15, wherein the feedback amplifier is configured to provide attenuation when the first switch is open and the second switch is closed.

18. The audio system of claim 15, wherein the first and second resistors are variable resistors.

19. The audio system of claim 15, wherein the third resistance (R3) and the fourth resistance (R4) are adjustable in response to a control signal.

20. The audio system of claim 15, wherein the voltage divider is a polysilicon resistor.

21. The audio system of claim 15, wherein the feedback amplifier is operably to provide a gain between about −57 dB and about 6 dB.

* * * * *